United States Patent
Miller et al.

[11] Patent Number: 6,061,293
[45] Date of Patent: May 9, 2000

[54] SYNCHRONOUS INTERFACE TO A SELF-TIMED MEMORY ARRAY

[75] Inventors: Jeffrey Lee Miller, Vancouver, Wash.; James Conary, Aloha, Oreg.

[73] Assignee: Intel Corporation, Santa Clara, Calif.

[21] Appl. No.: 09/002,094

[22] Filed: Dec. 31, 1997

[51] Int. Cl.⁷ .............................. G06F 12/00; G11C 8/00
[52] U.S. Cl. .......................................... 365/230.08; 711/3
[58] Field of Search .................. 711/211, 3; 365/230.08, 365/233

[56] References Cited

U.S. PATENT DOCUMENTS 5,511,033  4/1996  Jung ........................................ 365/222
5,701,436  12/1997  Nagashima et al. ..................... 395/489
5,802,596  11/1998  Shinozaki ................................. 711/169

*Primary Examiner*—Jack A Lane
*Attorney, Agent, or Firm*—Kenyon & Kenyon

[57] ABSTRACT

A synchronous interface to a self-timed memory array includes one or more address bus inputs and a first latch stage that includes one or more latches. Each of the latches of the first latch stage includes an input coupled to one of the address bus inputs and a first output. The synchronous interface further includes a second latch stage that includes a plurality of latches. Each of the latches of the second latch stage includes an input coupled to one of the first outputs of the first latch stage and a second output coupled to the memory array.

23 Claims, 7 Drawing Sheets

SYNCHRONOUS INTERFACE TO A SELF-TIMED MEMORY ARRAY

FIELD OF THE INVENTION

The present invention is directed to an interface to a memory array. More particularly, the present invention is directed to a synchronous interface to a self-timed memory array.

BACKGROUND OF THE INVENTION

Many computer devices operate based on an external clock. For example, a processor may receive a clock input and perform all operations or events only when the clock transitions. Devices in which events proceed based on a clock transition are referred to as "synchronous" devices.

Other computer devices do not base their operation on an external clock. These devices are referred to as "asynchronous" or "self-timed" devices. A memory array such as that contained in a cache subsystem is one example of a device that can be implemented as a self-timed device. A self-timed memory array typically receives a request from a processor (e.g., a read or write request). The memory array then performs the operation and indicates to the processor when the operation is complete. However, the time required for the operation to complete is not based on an external clock (i.e., a predetermined number of clock cycles). Rather, in the case of a self-timed cache subsystem, the time required is based on the asynchronous delay paths through the device, which may vary in duration based on the operations that are performed.

Self-timed devices typically have some performance advantages over synchronous devices. Specifically, self-timed devices have a lower speed power product than similar synchronous devices. A speed power product is the speed of the device multiplied by the power consumed by the device at a given frequency. With self-timed devices, power is only consumed during operations. In contrast, with synchronous devices, power is consumed by clock distribution buffers even when operations are not being performed.

Synchronous devices frequently are required to interact with self-timed devices. When a synchronous device interacts with self-timed memory arrays, there is a need for an input interface that receives input signals from the synchronous device.

Specifically, the device containing the self-timed memory array needs to accept input signals using the clock-based protocol of the synchronous device. For example, a synchronous device will typically drive valid data for a window of time around a clock edge or edges as defined by setup time (i.e., a valid time before a clock edge) and hold time (i.e., a valid time after a clock edge) specifications. The self-timed device, however, may need input data for a duration of time that is different (e.g., longer) than the synchronous time provides. Thus, a synchronous interface is needed to convert the input signals to a protocol that is compatible with the self-timed memory array timing requirements.

The interface must make the self-timed memory array appear to be a synchronous device to other devices. For maximum performance, the interface should also reduce input/output signal delay, and minimize the input signal setup time and hold time requirements.

Based on the foregoing, there is a need for such a synchronous interface to a self-timed memory array.

SUMMARY OF THE INVENTION

One embodiment of the present invention is a synchronous interface to a self-timed memory array. The synchronous interface includes one or more address bus inputs and a first latch stage that includes one or more latches. Each of the latches of the first latch stage includes an input coupled to one of the address bus inputs and a first output. The synchronous interface further includes a second latch stage that includes a plurality of latches. Each of the latches of the second latch stage includes an input coupled to one of the first outputs of the first latch stage and a second output coupled to the memory array.

DETAILED DESCRIPTION

Figure 1:
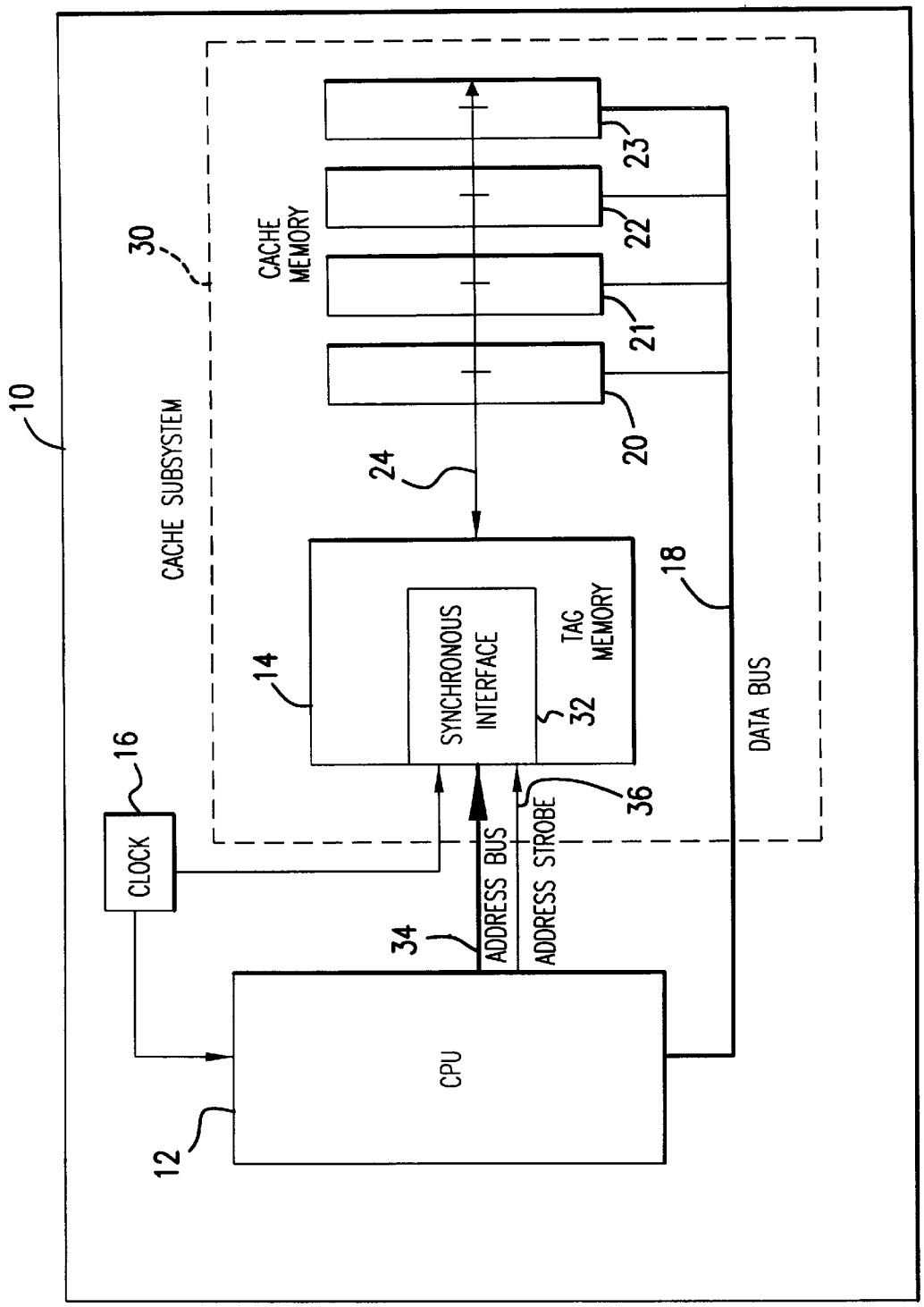
FIG. 1 is a block diagram partially illustrating one embodiment of a computer system that implements the present invention.

FIG. 1 is a block diagram partially illustrating one embodiment of a computer system that implements the present invention. The computer system 10 includes a central processing unit ("CPU") 12 and a cache subsystem 30 which is comprised of multiple memory arrays (e.g., a cache memory array and a tag memory array). CPU 12 is coupled to cache subsystem 30 through an address bus 34, an address strobe 36 and a data bus 18. Computer system 10 further includes a clock 16 which provides a clock signal to CPU 12 and cache subsystem 30.

Cache subsystem 30 includes a tag memory 14 and a plurality of cache memory 20–23. In one embodiment, cache memory 20–23 is comprised of a plurality of rows of high-speed static random access memory ("SRAM"). Cache memory 20–23 stores memory blocks from the main memory (not shown in FIG. 1) of computer system 10. CPU 12 can access the memory blocks stored in cache memory 20–23 more quickly than memory blocks stored in the main memory.

Each memory block stored in cache memory 20–23 is assigned a unique identifier, referred to as a "tag." Tags memory 14 stores the tags for each cached memory block. CPU 12 requests access to a cached memory block via address bus 34 and address strobe 36. Address strobe 36 indicates when a valid address is on address bus 34.

Tag memory 14 receives a request for a memory block from CPU 12. The request includes a memory address on address bus 34 and a valid address signal on address strobe 36. Tag memory 14 decodes the memory address, and determines whether the requested memory block is stored in cache memory 20–23. If so, the requested memory block is selected from cache memory 20–23 via select line 24. The selected memory block is then transferred to CPU 12 from cache memory 20–23 via data bus 18. Tag memory 14 generates an "end operation" signal when a self-timed cache operation is complete and cache subsystem 30 is able to accept another request from CPU 12.

CPU 12 is a synchronous device because all of its operations are based on clock 16. In contrast, cache subsystem 30 is a self-timed device because each cache operation requires a variable amount of time that is not synchronized with clock 16. Therefore, cache subsystem 30 includes a synchronous interface 32. Synchronous interface 32 allows cache subsystem 30 to appear to be a synchronous device to CPU 12.

Figure 2:
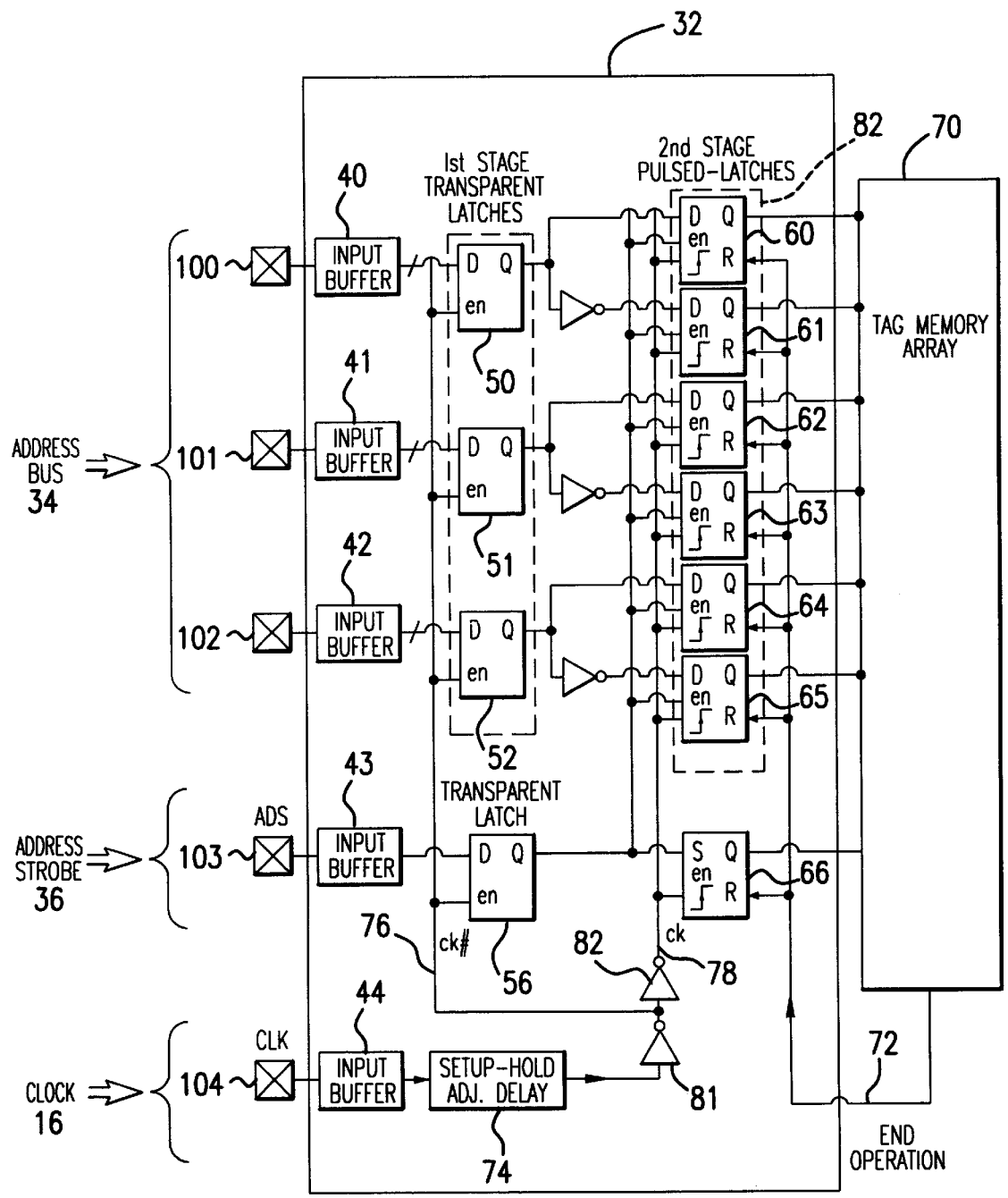
FIG. 2 is a circuit diagram of a synchronous interface in accordance with one embodiment of the present invention.

FIG. 2 is a circuit diagram of synchronous interface 32 coupled to the tag memory array 70 of cache subsystem 30. Synchronous interface 32 receives address bus 34 and address strobe 36 as inputs from CPU 12. In the embodiment of FIG. 2, address bus 34 is a three-bit address bus. However, in other embodiments, address bus 34 can comprise any number of bits. Address bus 34 is received on input pads 100–102. Address strobe 36 is received on ADS input pad 103. Clock 16 is received on CLK input pad 104. Each input pad 100–104 is coupled to an input buffer 40–44, respectively.

CLK input buffer 44 is coupled to a setup and hold time adjustment delay circuit 74. Setup and hold time adjustment delay circuit 74 adjusts the setup and hold time of synchronous interface 32. An inverter 81 is coupled to delay circuit 74 and outputs "ck# signal" on a line 76. Ck# signal is a delayed inverse signal of clock 16. An inverter 82 is coupled to inverter 81 and outputs "ck signal" on line 78. Ck signal is a delayed signal of CLK 104.

Synchronous interface 32 includes a plurality of transparent latches 50–52 and 56. In one embodiment, transparent latches 50–52 and 56 are D-type latches or flip-flops. ADS input buffer 43 is coupled to a D-input of transparent latch 56. The enable input of transparent latch 56 is coupled to line 76 (ck# signal).

Figure 3A:
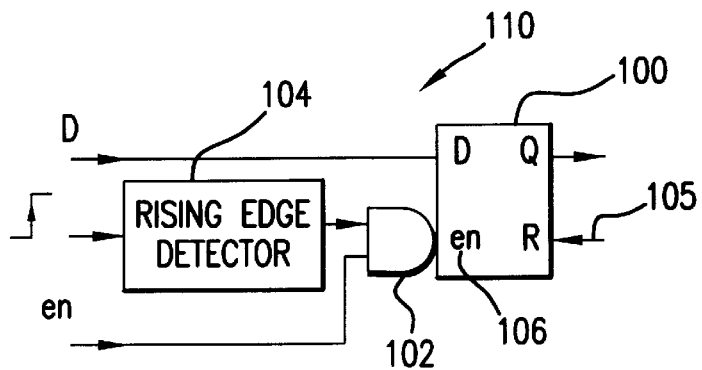
FIGS. 3*a* and 3*b* are block and circuit diagrams, respectively, of one embodiment of a pulsed transparent latch.
Figure 3B:
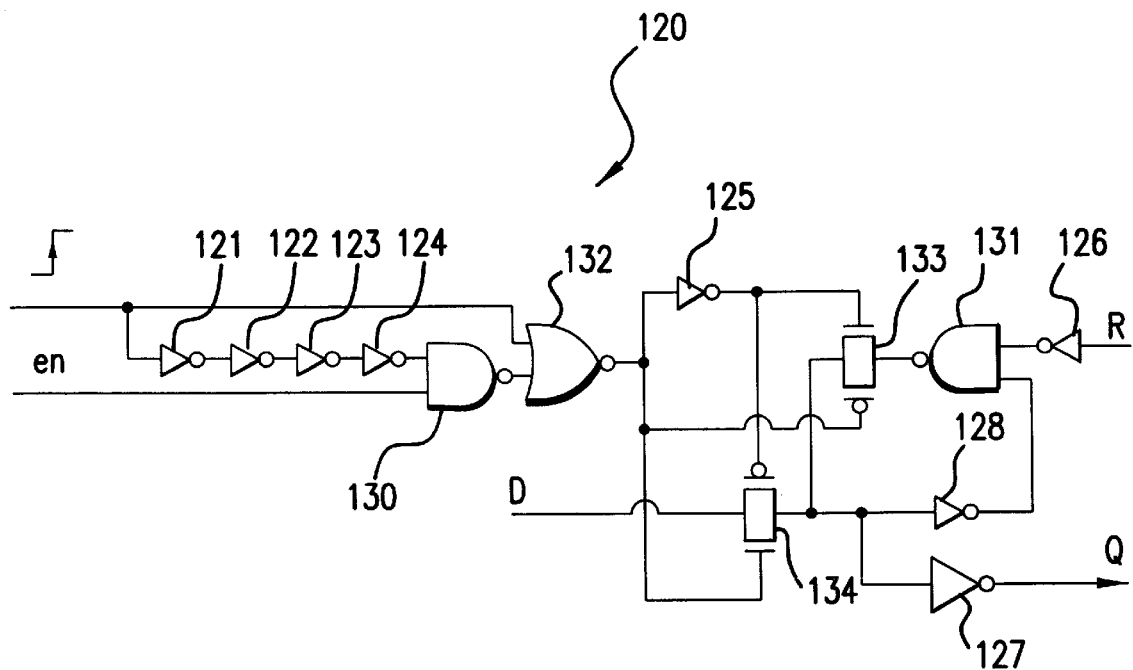

Synchronous interface 32 further includes a plurality of pulsed latches 60–65. In one embodiment, pulsed latches 60–65 are "pulsed transparent" latches. In another embodiment, pulsed latches 60–65 are "pulsed set" latches. FIGS. 3a and 3b are block and circuit diagrams, respectively, of one embodiment of a pulsed transparent latch which can be used for pulsed latches 60–65 of FIG. 2.

Pulsed transparent latch 110 of FIG. 3a includes a D-type transparent latch 100. D-type latch 100 includes a D-input, a Q-output, a reset input 105 and an enable input 106. Pulsed latch 110 further includes a dual input AND gate 102 and a rising edge detector 104. The output of AND gate 102 is coupled to enable input 106. A rising edge signal is coupled to the input of rising edge detector 104. The output of rising edge detector 104 is coupled to one input of AND gate 102 and an enable signal is coupled to the other input of AND gate 102. In operation, the D-input of latch 100 is output at the Q-output on the rising edge of the rising edge signal when the enable signal is high.

Pulsed transparent latch 120 of FIG. 3b is implemented with a plurality of inverters 121–128, NAND gates 130 and 131, NOR gate 132, and pass gates 133 and 134. Pass gates 133 and 134 each comprise a pair of transistors.

Figure 4A:
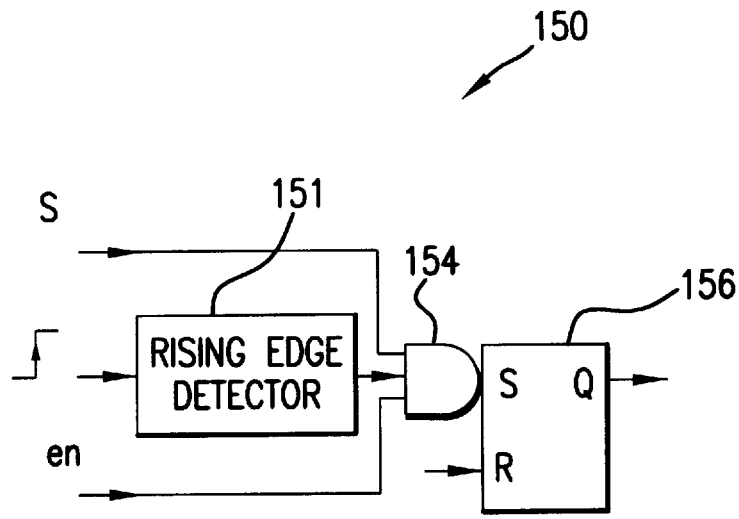
FIGS. 4*a* and 4*b* are block and circuit diagrams, respectively, of one embodiment of a pulsed set latch.
Figure 4B:
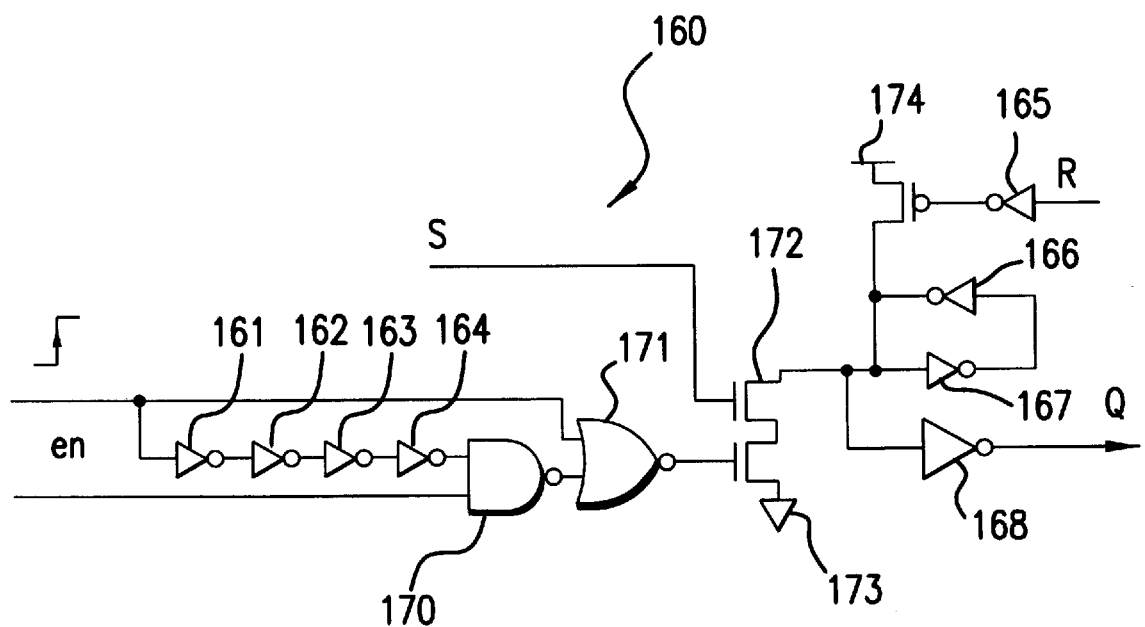

Referring again to FIG. 2, synchronous interface 32 further includes a pulsed latch 66. In one embodiment, pulsed latch 66 is a "pulsed set" latch. FIGS. 4a and 4b are block and circuit diagrams, respectively, of one embodiment of a pulsed set latch which can be used for pulsed latch 66 of FIG. 2 and can be used for pulsed latches 60–65 of FIG. 2.

Pulsed set latch 150 of FIG. 4a includes a set/reset latch 156. Set/reset latch 156 includes an S-input, a Q-output and a reset input. Pulsed set latch 150 further includes a triple input AND gate 154 and a rising edge detector 151. The output of AND gate 154 is coupled to the S-input of latch 156. A rising edge signal is coupled to the input of rising edge detector 151. The output of rising edge detector 151 is coupled to one input of AND gate 154, and an enable signal and an S-input signal is coupled to the other inputs of AND gate 154. In operation, the rising edge of the rising edge signal is output at the Q-output of latch 156 when the S-input signal and the enable signal are high.

Pulsed set latch 160 of FIG. 4b is implemented with a plurality of inverters 161–168, a NAND gate 170 and a NOR gate 171. Pulsed set latch 160 further includes a plurality of transistors 172–174.

Referring again to FIG. 2, the Q-output of transparent latch 56 is coupled to an S-input of pulsed latch 66. The pulsed input of pulsed latch 66 is coupled to line 78 (ck signal). The Q-output of latch 66 is received by tag memory array 70 as an address strobe. End operation line 72 from tag memory array 70 is coupled to the reset input of latch 66.

Address bus 34 bits received from address bus pads 100–102 pass through two stages of latches. The first stage of latches, latch stage 80, includes the plurality of transparent latches 50–52 corresponding to each input buffer 40–42. The outputs of input buffers 40–42 are coupled to the D-inputs of latches 50–52, respectively. Line 76 (ck# signal) is coupled to the enable inputs of latches 50–52.

In operation, latch stage 80 is controlled by the ck# signal only. Therefore, the setup and hold time of address bus inputs 100–102 are dependent only on clock 16. This satisfies the timing requirements of synchronous interface 32. The setup and hold times of input signals received by synchronous interface 32 can be minimized because they are independent of address strobe 36.

The second stage of latches, latch stage 82, includes latches 60–65. Line 78 (ck signal) is coupled to the pulsed inputs of latches 60–65. The Q-output of latch 56 is coupled to the enable input of latches 60–65. End operation line 72 from memory array 70 is coupled to the reset inputs of latches 60–65.

Each latch 50–52 of latch stage 80 has a corresponding pair of latches 60–65 in latch stage 82. The respective Q-outputs of latches 50–52 and their inverse are coupled to the D-inputs of the respective latches of latch stage 82 (or the S-inputs if latches 60–65 are pulsed set latches). For example, the Q-output of latch 50 is coupled to the D-input of latch 60 and the inverse of the Q-output of latch 50 is coupled to the D-input of latch 61.

In operation, latches 60–65 of latch stage 82 are strobed on by address strobe 36 and the rising edge of the ck signal. Further, latches 60–65 are reset asynchronously when access to tag memory array 70 is complete, as indicated by end operation line 72. This satisfies the self-timed requirement of synchronous interface 32.

The two stages of latches, latch stages 80 and 82, work in combination to capture and hold data from address bus 34 for the duration of time required for tag memory array 70. Transparent latches 50–52 of latch stage 80 act as master latches and are enabled by the ck# signal. Pulsed latches 60–65 of latch stage 82 act as slave-latches to capture address data on the rising edge of the ck signal when enabled by the output of latch 56.

In synchronous interface 32, address strobe 36 is sampled by tag memory array 70 on the rising edge of clock 16. In contrast, address bus 34 is sampled by memory array 70 on the rising edge of clock 16 if and only if address strobe 36 is asserted. Tag memory array 70 is self-timed and will perform an access (i.e., read or write) asynchronously relative to clock 16.

Tag memory array 70 is allowed two or more clock 16 periods to complete an access before another access is permitted. The number of clock 16 periods allowed for a given array access is determined by the spacing between strobes on address strobe 36. For example, at a low clock 16 frequency, the minimum spacing of the strobes on address strobe 36 may be set to two clock 16 cycles. However, at higher clock 16 frequencies, the minimum spacing of the strobes on address strobe 36 may be set to three or more clock 16 cycles to accommodate the same tag memory array 70 access.

Synchronous interface 32 provides many advantages. For example, some prior art synchronous interfaces require extra circuitry to insure alternate minimum clock cycle spacings between address strobe signals. However, in synchronous interface 32, latch stage 82 is not updated until the next strobe on address strobe 36 occurs, regardless of the strobe spacing on address strobe 36. Further, synchronous interface 32 minimizes address bus 34 setup and hold windows. In synchronous interface 32, setup and hold requirements are relative only to latch stage 80 and are dependent only on the path from CLK 104 to the ck# signal.

Figure 5:
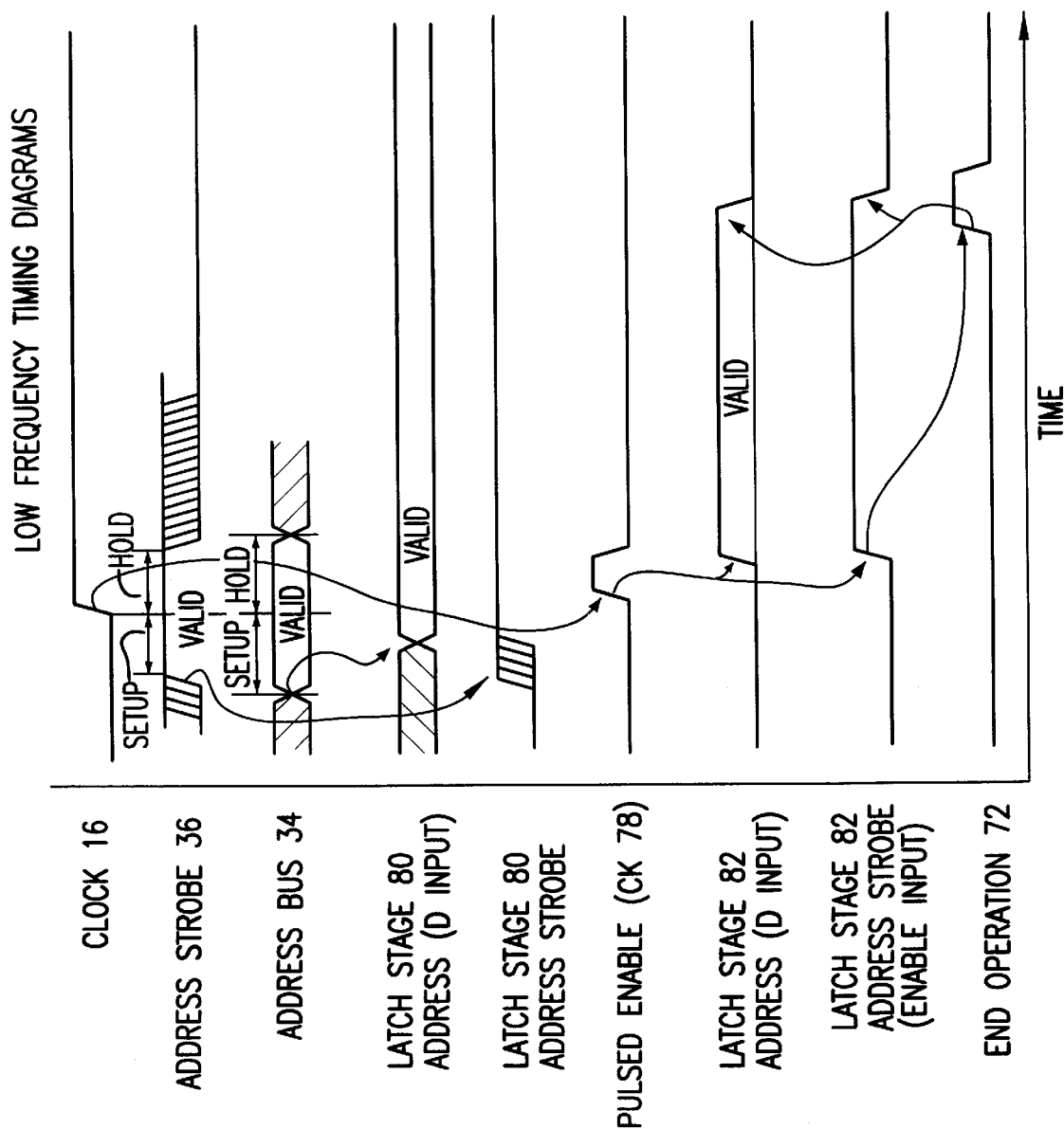
FIG. 5 is a timing diagram illustrating the operation of the synchronous interface at a low frequency.

Synchronous interface 32 can also be used to interface additional signals received in conjunction with address strobe 36. For example, a command signal on a command bus that is sent along with address strobe 36 can be interfaced using two stage of latches in the same manner as the address bus 34 signals FIG. 5 is a timing diagram illustrating the operation of synchronous interface 32 at a low frequency. As shown, the pulse enable ck 78 signal captures the address data and address strobe on latch stage 82. The address data and address strobe are held until end operation 72 signal is received. If latch stage 82 was not pulsed enabled, then the enable input of latch stage 82 would be in contention with the end operation 72 reset signal when synchronous interface 32 is operated at low frequency.

Figure 6:
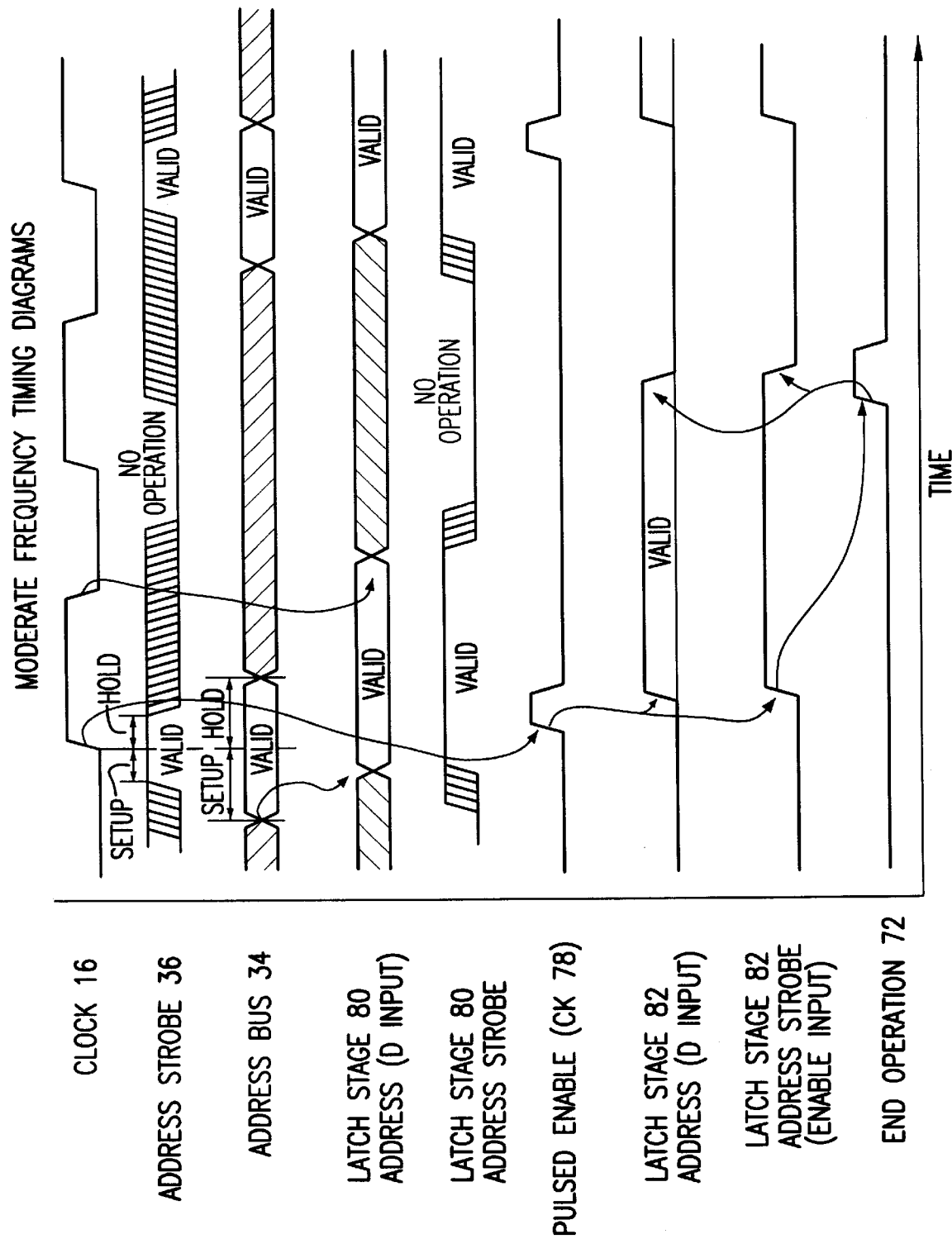
FIG. 6 is a timing diagram illustrating the operation of the synchronous interface at a moderate frequency.

FIG. 6 is a timing diagram illustrating the operation of synchronous interface 32 at a moderate frequency. FIG. 6 illustrates that the value of address bus 34 only matters when address strobe 36 is high during the rising edge of clock 16 (note the "no operation" of address strobe 36 during the second rising edge of clock 16 and the effect on the latch stage 80 address).

Figure 7:
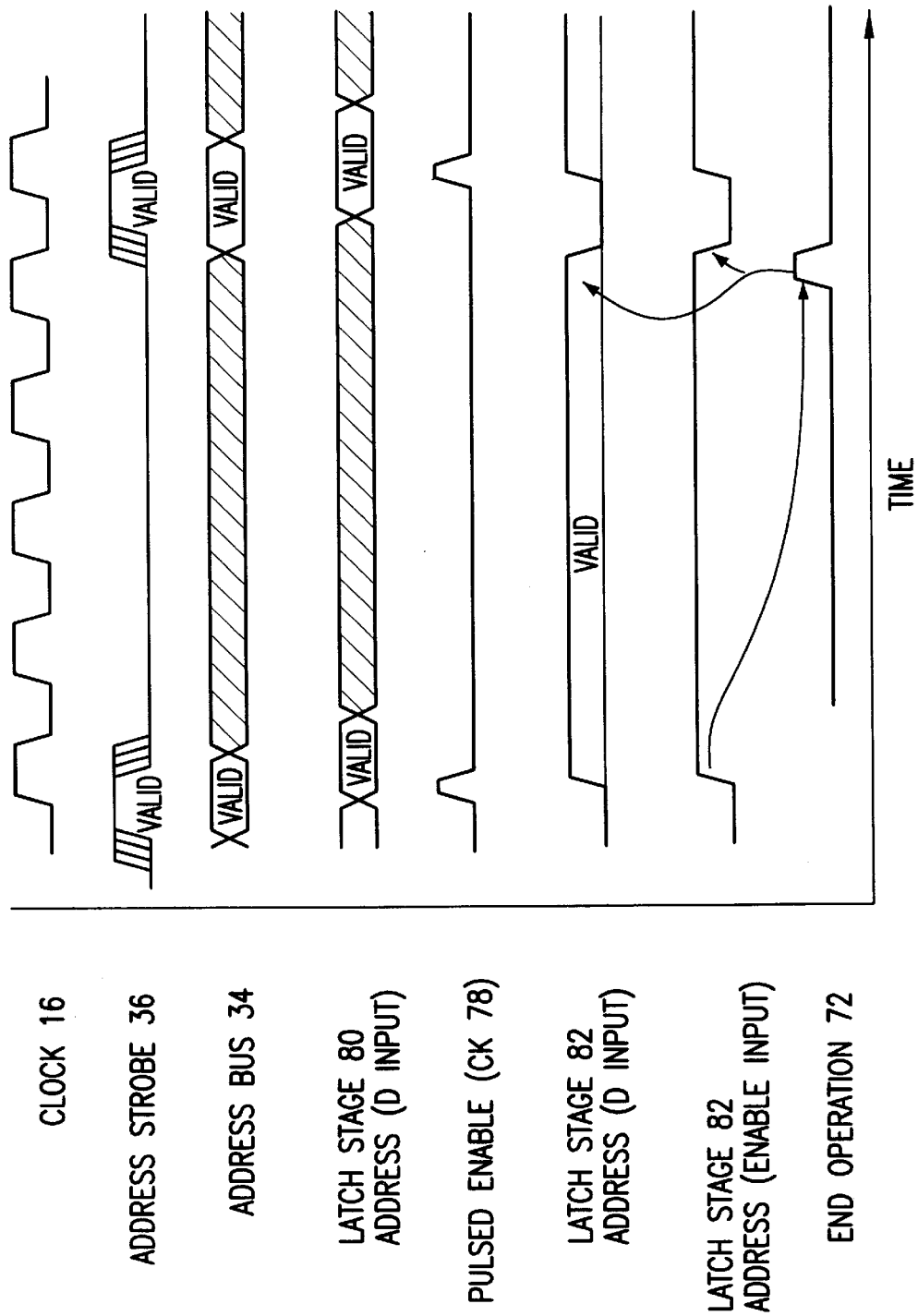
FIG. 7 is a timing diagram illustrating the operation of the synchronous interface at a high frequency.

FIG. 7 is a timing diagram illustrating the operation of synchronous interface 32 at a high frequency. As shown in FIG. 7, the duration of access to tag memory array 70 can span multiple clock 16 cycles at a high frequency.

Several embodiments of the present invention are specifically illustrated and/or described herein. However, it will be appreciated that modifications and variations of the present invention are covered by the above teachings and within the purview of the appended claims without departing from the spirit and intended scope of the invention.

For example, although the embodiments disclosed provide a synchronous interface to a tag memory array, the present invention can be implemented as an interface to any type of self-timed device.

What is claimed is:

1. A synchronous interface to a self-timed memory array which outputs an end operation signal, said interface comprising:

one or more address bus inputs;

a clock input;

a first latch stage including one or more first latches, each of said first latches including an input coupled to one of said address bus inputs, an enable input coupled to said clock input and a first output;

an address strobe input; and a second latch stage including a plurality of second latches, each of said second latches including an input coupled to one of said first outputs, an enable input coupled to said address strobe input, a rising edge input coupled to said clock input and a reset input coupled to the end operation signal and a second output coupled to said memory array.

2. The synchronous interface of claim 1, wherein said first latches are transparent latches.

3. The synchronous interface of claim 1, wherein said second latches are pulsed latches.

4. The synchronous interface of claim 3, wherein said second latches are pulsed transparent latches.

5. The synchronous interface of claim 3, wherein said second latches are pulsed set latches.

6. The synchronous interface of claim 3, wherein said pulsed latches comprise:

a D-type flip-flop having a reset input and an enable input;

an AND gate having an input and having an output coupled to said enable input; and a rising edge detector coupled to said AND gate input.

7. The synchronous interface of claim 1, wherein the memory array is a cache subsystem.

8. The synchronous interface of claim 1, wherein said clock input is coupled to an adjustment delay circuit.

9. The synchronous interface of claim 1, wherein each of said first output is coupled to an inverter having an output, and said inverter output is coupled to one of said second latches input.

10. The synchronous interface of claim 1, further comprising a third latch, said third latch including an input coupled to said address strobe input, an enable input coupled to said clock input and an output coupled to said enable inputs of each of said second latches, wherein said third latch is a transparent latch.

11. A computer system comprising:

an address bus including one or more address bus bits;

a central processing unit coupled to said address bus; and a memory subsystem including a synchronous interface and a memory array, wherein said synchronous interface comprises:

a clock input;

a first latch stage including one or more first latches, each of said first latches including an input coupled to one of said address bus bits, an enable input coupled to said clock input and a first output;

an address strobe input; and a second latch stage including a plurality of second latches, each of said second latches including an input coupled to one of said first outputs, an enable input coupled to said address strobe input, a rising edge input coupled to said clock input and a reset input coupled to the end operation signal and a second output coupled to said memory array.

12. The computer system of claim 11, wherein said first latches are transparent latches.

13. The computer system of claim 11, wherein said second latches are pulsed latches.

14. The computer system of claim 13, wherein said memory array is a cache subsystem.

15. The computer system of claim 13, wherein said clock input is coupled to an adjustment delay circuit.

16. The computer system of claim 13, wherein each of said first output is coupled to an inverter having an output, and said inverter output is coupled to one of said second latches input.

17. The computer system of claim 11, wherein said synchronous interface further comprises a third latch, said third latch including an input coupled to said address strobe input, an enable input coupled to said clock input and an output coupled to said enable inputs of each of said second latches.

18. The computer system of claim 13, wherein said central processing unit is a synchronous device and said memory array is a self-timed device.

19. A method of interfacing a self-timed memory array to a plurality of address bus signals, a clock signal and an address strobe signal, said method comprising the steps of:

inputting the address bus signals to a first latch stage having an output, wherein the first latch stage is enabled by the clock signal;

inputting the output of the first latch stage to a second latch stage having an output, wherein the second latch stage is enabled by the address strobe signal and pulsed by the clock signal; and providing the output of the second latch stage to the memory array.

20. The method of claim 19, further comprising the steps of:

receiving an end operation signal from the memory array; and resetting the second latch stage based on the end operation signal.

21. The method of claim 19, wherein the first latch stage comprises one or more transparent latches.

22. The method of claim 19, wherein the second latch stage comprises a plurality of pulsed latches.

23. The method of claim 20, further comprising the step of:

delaying the clock signal to adjust a setup and hold time.

* * * * *